(12) United States Patent
Palm (10) Patent No.: US 11,430,669 B2
(45) Date of Patent: Aug. 30, 2022

(54) FORMING A LOCK STRUCTURE IN A SEMICONDUCTOR CHIP PAD

(71) Applicant: Infineon Technologies AG, Neubiberg (DE)

(72) Inventor: Petteri Palm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 16/931,973

(22) Filed: Jul. 17, 2020

(65) Prior Publication Data

US 2021/0020458 A1  Jan. 21, 2021

(30) Foreign Application Priority Data

Jul. 18, 2019  (DE) .......................... 102019119521.7

(51) Int. Cl.
*H01L 21/56* (2006.01)
*H01L 21/3213* (2006.01)
*H01L 23/00* (2006.01)

(52) U.S. Cl.
CPC ........ *H01L 21/56* (2013.01); *H01L 21/32131* (2013.01); *H01L 21/32134* (2013.01); *H01L 21/32135* (2013.01); *H01L 21/32139* (2013.01); *H01L 24/05* (2013.01); *H01L 2224/05124* (2013.01); *H01L 2224/05155* (2013.01); *H01L 2224/05184* (2013.01); *H01L 2224/05647* (2013.01)

(58) Field of Classification Search
CPC ............... H01L 21/56; H01L 21/32131; H01L 21/32134; H01L 21/32135; H01L 21/32139; H01L 24/05; H01L 2224/05124; H01L 2224/05155; H01L 2224/05184; H01L 2224/05647; H01L 24/19; H01L 24/20; H01L 2224/04105; H01L 23/3121; H01L 23/3142; H01L 23/3114; H01L 24/06; H01L 23/31; H01L 23/482; H01L 24/03; H01L 2224/03; H01L 2224/0605

See application file for complete search history.

(56) References Cited

U.S. PATENT DOCUMENTS

| 10,424,525 | B2 * | 9/2019 | Ziglioli | ............ H01L 21/31058 |
| 2001/0016415 | A1 | 8/2001 | Chen | |
| 2002/0115280 | A1 | 8/2002 | Lin et al. | |
| 2011/0095410 | A1 * | 4/2011 | Gomez | ............... H01L 23/3107 257/676 |
| 2015/0287685 | A1 * | 10/2015 | Sarihan | .................. H05K 1/111 257/774 |
| 2018/0310413 | A1 * | 10/2018 | Kasai | ..................... H01L 23/498 |

FOREIGN PATENT DOCUMENTS

| DE | 102011076866 A1 | 12/2012 |
| EP | 0352020 A2 | 1/1990 |
| JP | H04368140 A | 12/1992 |
| JP | H05343466 A | 12/1993 |

* cited by examiner

*Primary Examiner* — Mamadou L Diallo (74) *Attorney, Agent, or Firm* — Murphy, Bilak & Homiller, PLLC

(57) ABSTRACT

A method of manufacturing a chip package is provided. The method includes patterning at least one chip pad of a chip to form a patterned structure in the at least one chip pad, the patterned structure including at least one predefined recess, and encapsulating the chip with encapsulating material, thereby filling the at least one predefined recess.

9 Claims, 9 Drawing Sheets

Patterning at least one chip pad of a chip to form a patterned structure in the at least one chip pad, the patterned structure comprising at least one predefined recess

920

Encapsulating the chip with encapsulating material, thereby filling the at least one predefined recess

FORMING A LOCK STRUCTURE IN A SEMICONDUCTOR CHIP PAD

TECHNICAL FIELD

Various embodiments relate generally to a chip package and to a method of manufacturing a chip package.

BACKGROUND

Figure 1:
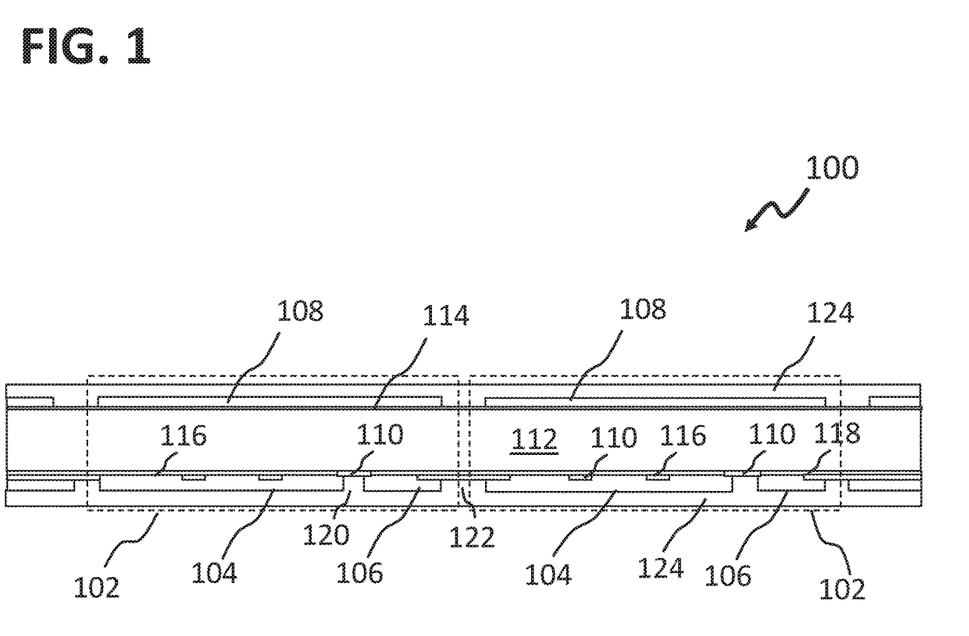
FIG. 1 illustrates a cross-sectional view of a chip package arrangement according to a prior art.
Figure 2:
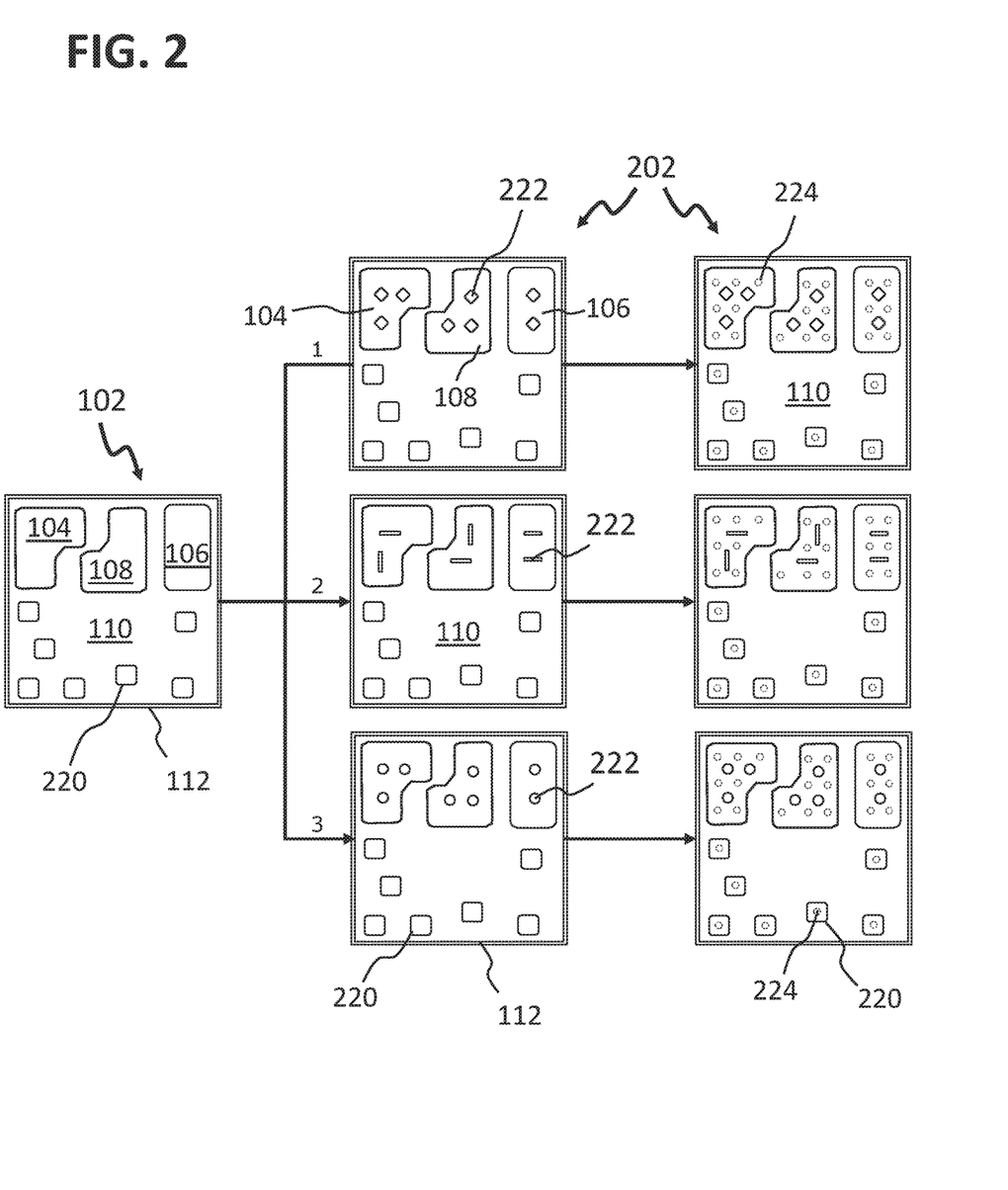
FIG. 2 illustrates top views of a chip package according to a prior art and of chip packages according to various embodiments, respectively.

In die packages, in particular laminated die packages, for example double sided chip embedding products (CE), an example of which is shown in FIG. 2, an adhesion between a metallization 104, 106, 108 of a semiconductor die/chip 112 and an encapsulating material 124 (for example a printed circuit board (PCB) laminate material) may be weaker than desired. As a consequence, in current CE products, one of the biggest challenges may be the delamination between the relatively smooth, possibly large die Cu surface 104, 106, 108 and the PCB laminate materials 124. The larger the copper area is, the higher the risk of delamination.

Attempts to solve the problem include for example adding an additional polyimide layer on the metallization. However, this makes it necessary to later drill through the polyimide passivation, and to remove residues with a de-smear process before a subsequent plating process, which may be complicated or even impossible. Furthermore, the polyimide may only be applied to the die front side, and thus may not be able to provide a solution for a die package that includes two or more dies mounted with different orientations, i.e. one die with its frontside facing a carrier and the other die with its backside facing the carrier.

Another attempt includes a so-called Cu roughening, which means a roughening of a copper surface, which was possible because the dies were first diffusion soldered onto a copper (Cu) leadframe, and the leadframe with the chip could be subjected to, e.g., a wet chemical process for the roughening and before the lamination process without damaging the leadframe. However, other chip embedding processes may be more complicated. For example, the roughening of a die front side (or, more generally, the side that is facing down during bonding) may only be possible after a first lamination process, but it may be risky, because the laminate material may be only partially cured after the first lamination and may thus get damaged during the roughening process. Also, the roughening may be impossible to do to the backside of the die (or, more generally, the side that is facing down during bonding).

For a current CE chip embedding process flow, no actual solution exists for increasing an adhesion of both die surfaces, i.e. of a fro side and of a backside.

SUMMARY

A method of manufacturing a chip package is provided. The method may include patterning at least one chip pad of a chip to form a patterned structure in the at least one chip pad, the patterned structure including at least one predefined recess, and encapsulating the chip with encapsulating material, thereby filling the at least one predefined recess.

BRIEF DESCRIPTION OF THE DRAWINGS

In the drawings, like reference characters generally refer to the same parts throughout different views. To avoid crowding, some of the references that would have been duplicated may have been omitted. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a lock structure between a chip pad and a mold or a laminate in a CE type chip package is provided.

In various embodiments, a (large) copper pad, e.g. a front-and/or backside, of a chip (e.g. a transistor, e.g. a SiC-transistor or a GaN-transistor, e.g. a MOSFET or an IGBT, or a different component) in a chip package may be structured for improving an adhesion between the copper pad and the mold and for reducing a risk of delamination.

Putting it differently, a (for example copper) chip pad metallization area may be at least partly split into smaller areas to form lock structures for a mold/laminate encapsulation, e.g. recesses that may be filled by the mold/laminate, to reduce the risk of delamination by decreasing a surface area between the mold/(PCB-)laminate and the chip (e.g. copper) metallization with openings in the metallization. The openings may reduce the (e.g. copper) metallization area that is in direct contact to the laminate. This may reduce stress at the metallization-encapsulation interface, and therefore reduce a risk of delamination.

The lock structures for the mold/laminate may be used on both sides of the chip. The lock structures may in various embodiments extend fully though the (e.g. Cu) metallization. This may have an advantage of easier processing, since no additional processing may be required.

In other embodiments, the lock structures may extend only partially though the Cu metallization, which may require additional photolithography and etching processes. In various embodiments, the lock structures (e.g. openings) may be created using an etching process after the power metal is plated. In a case of the pattern plating process forming the structured metallization, the plating mask may already be patterned before plating.

FIG. 2 illustrates top views of a chip package 102 according to a prior art and of chip packages 202 according to various embodiments, respectively.

Figure 3:
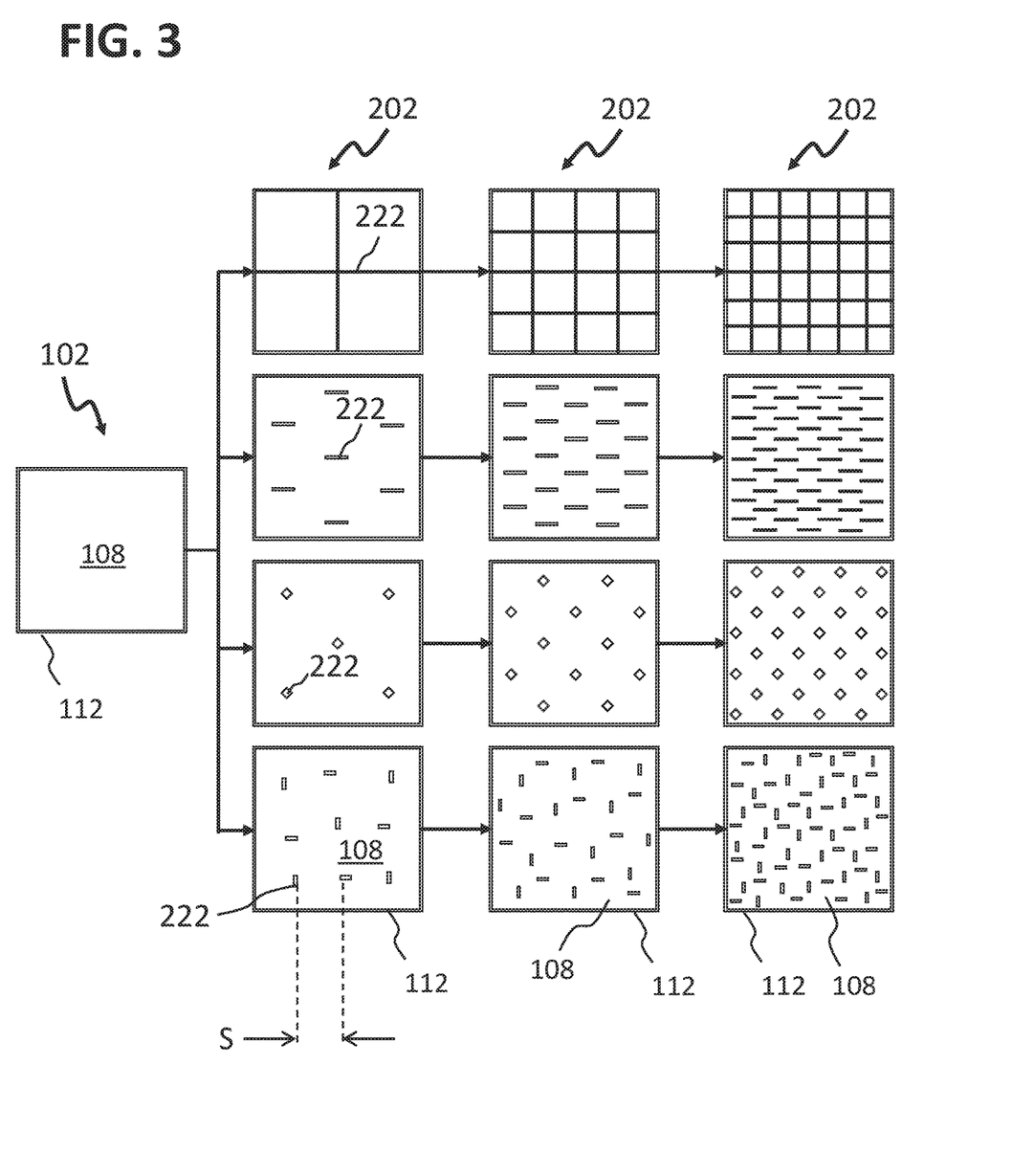
FIG. 3 illustrates bottom views of a chip package according to a prior art and of chip packages according to various embodiments, respectively.
Figure 4:
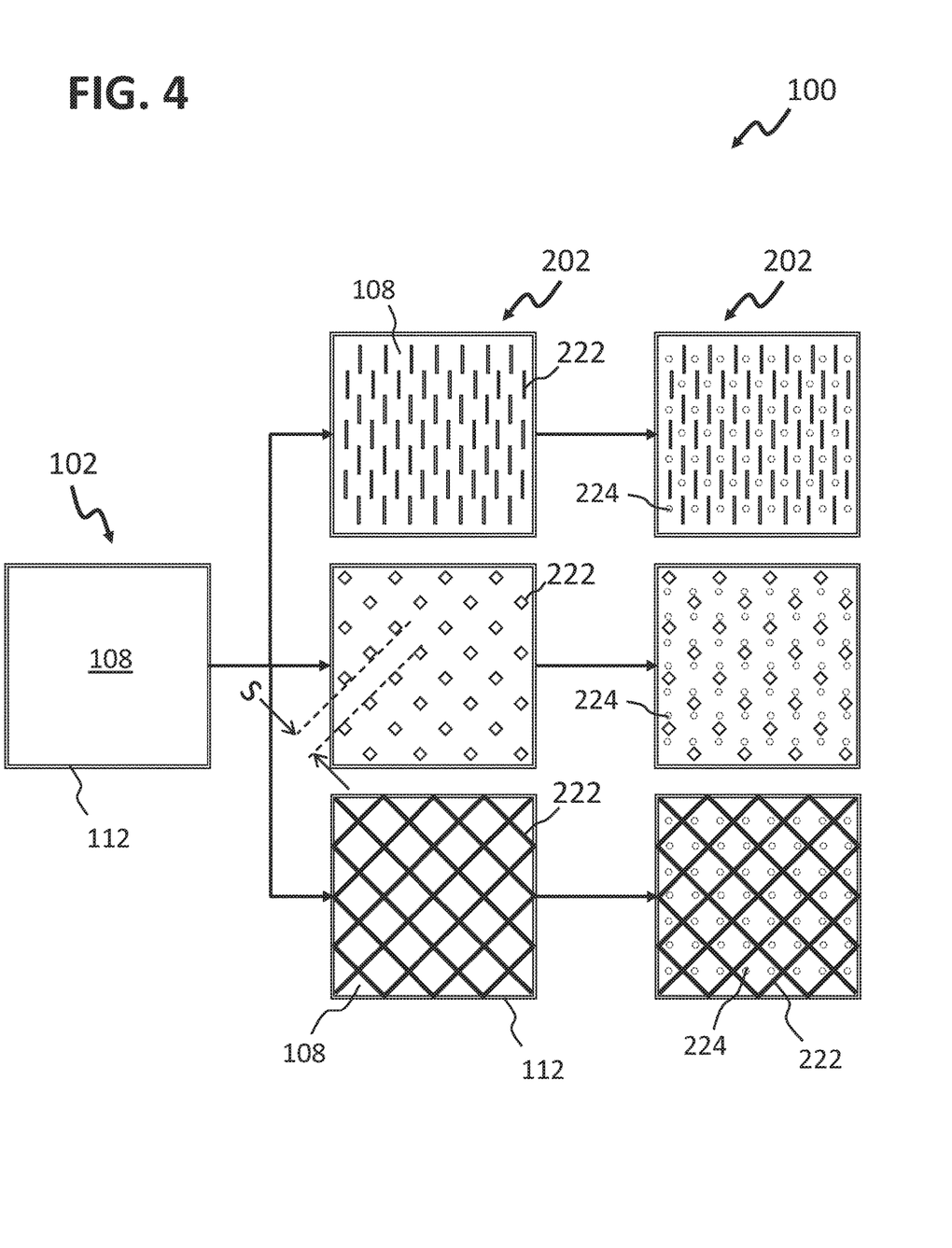
FIG. 4 illustrates bottom views of a chip package according to a prior art and of chip packages according to various embodiments, respectively.
Figure 5:
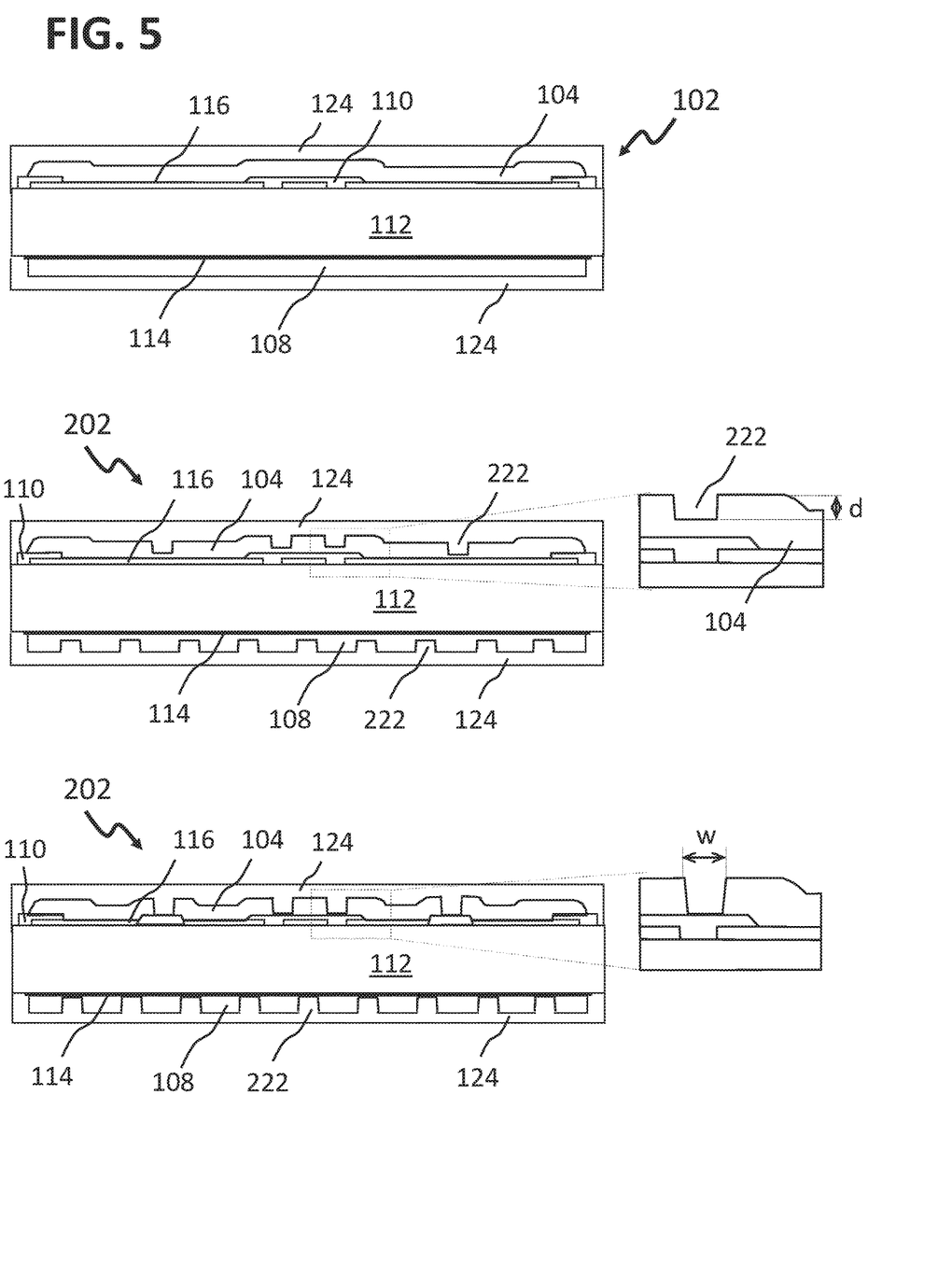
FIG. 5 illustrates a cross-sectional view of a chip package according to a prior art, and cross-sectional views (with a zoomed in view for each) of chip packages according to various embodiments.
Figure 6:
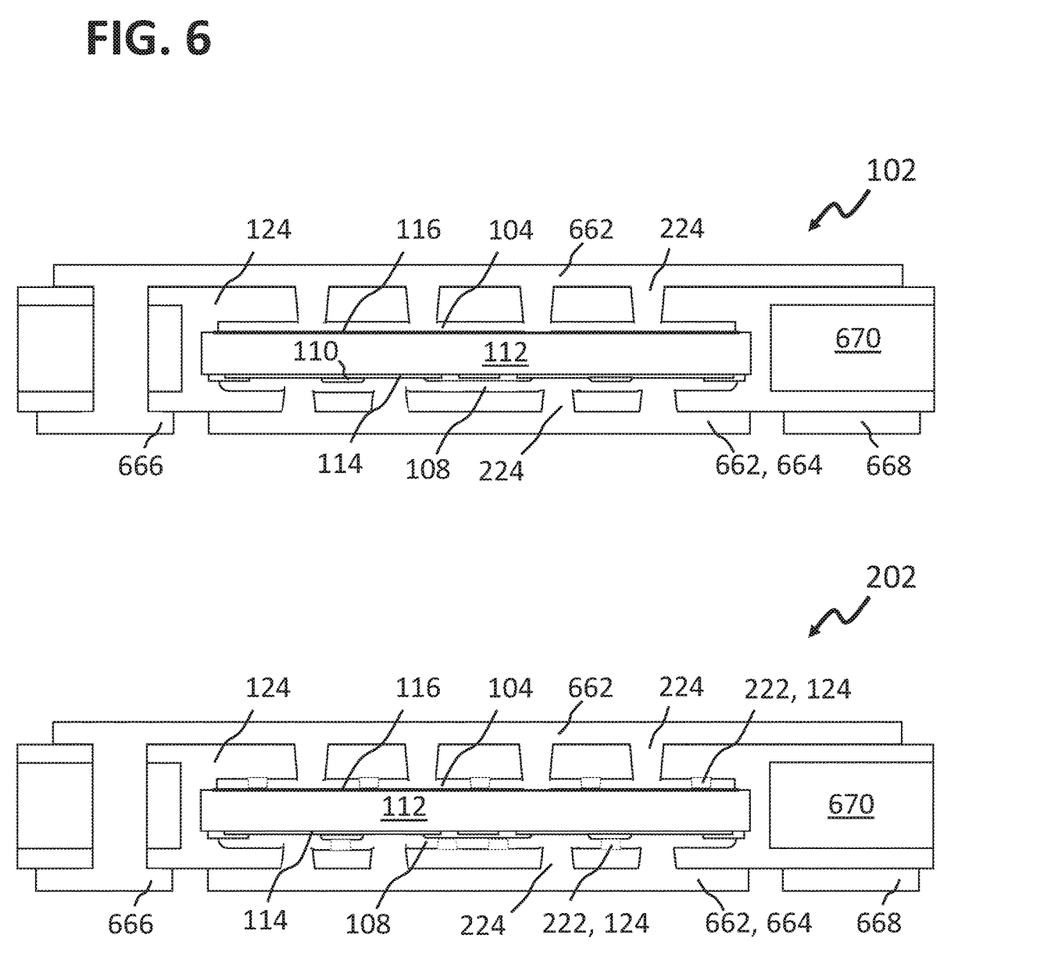
FIG. 6 illustrates cross-sectional views of chip packages according to various embodiments.
Figure 7:
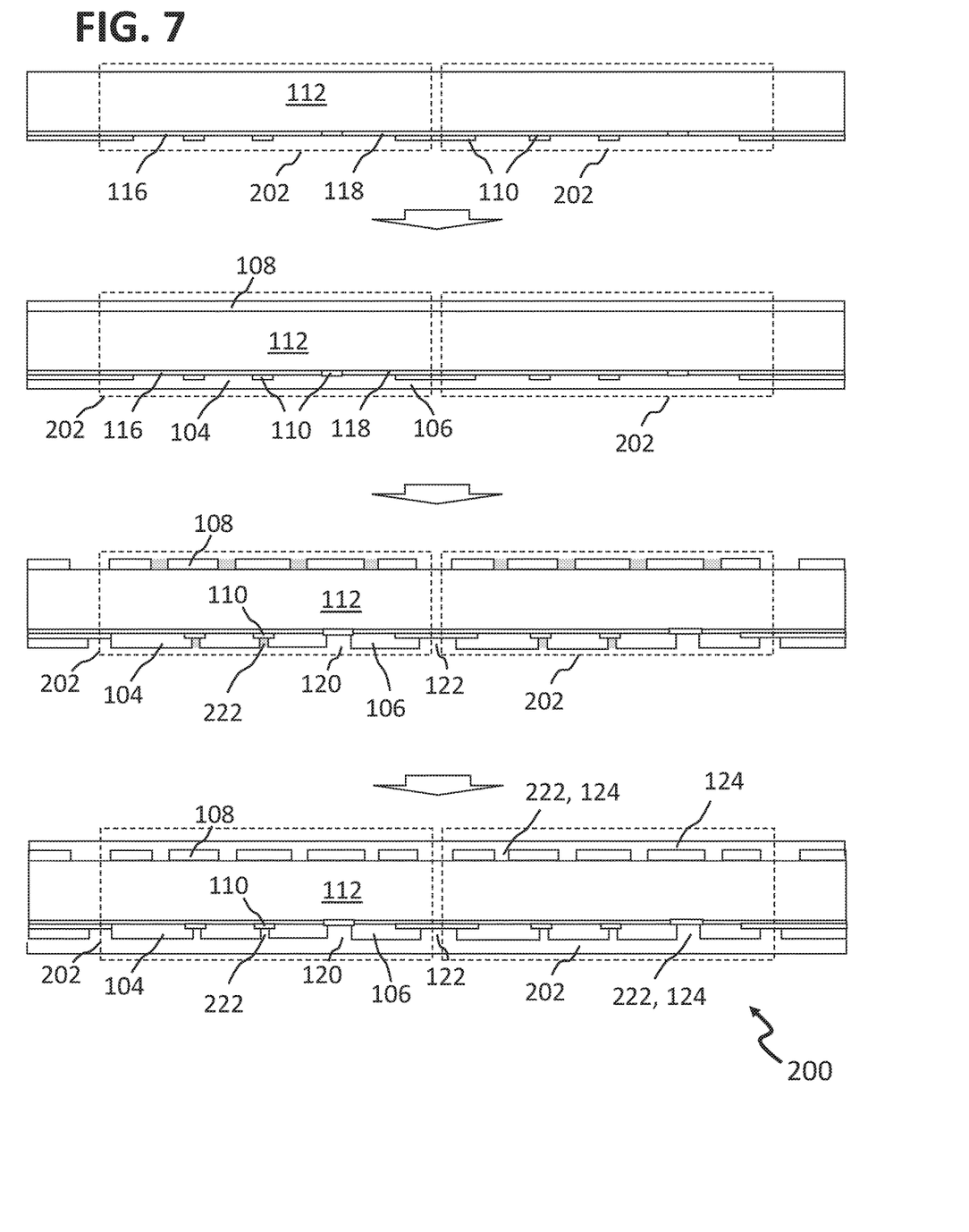
FIG. 7 illustrates, as a sequence of cross-sectional views, a process of forming a chip package in accordance with various embodiments.
Figure 8:
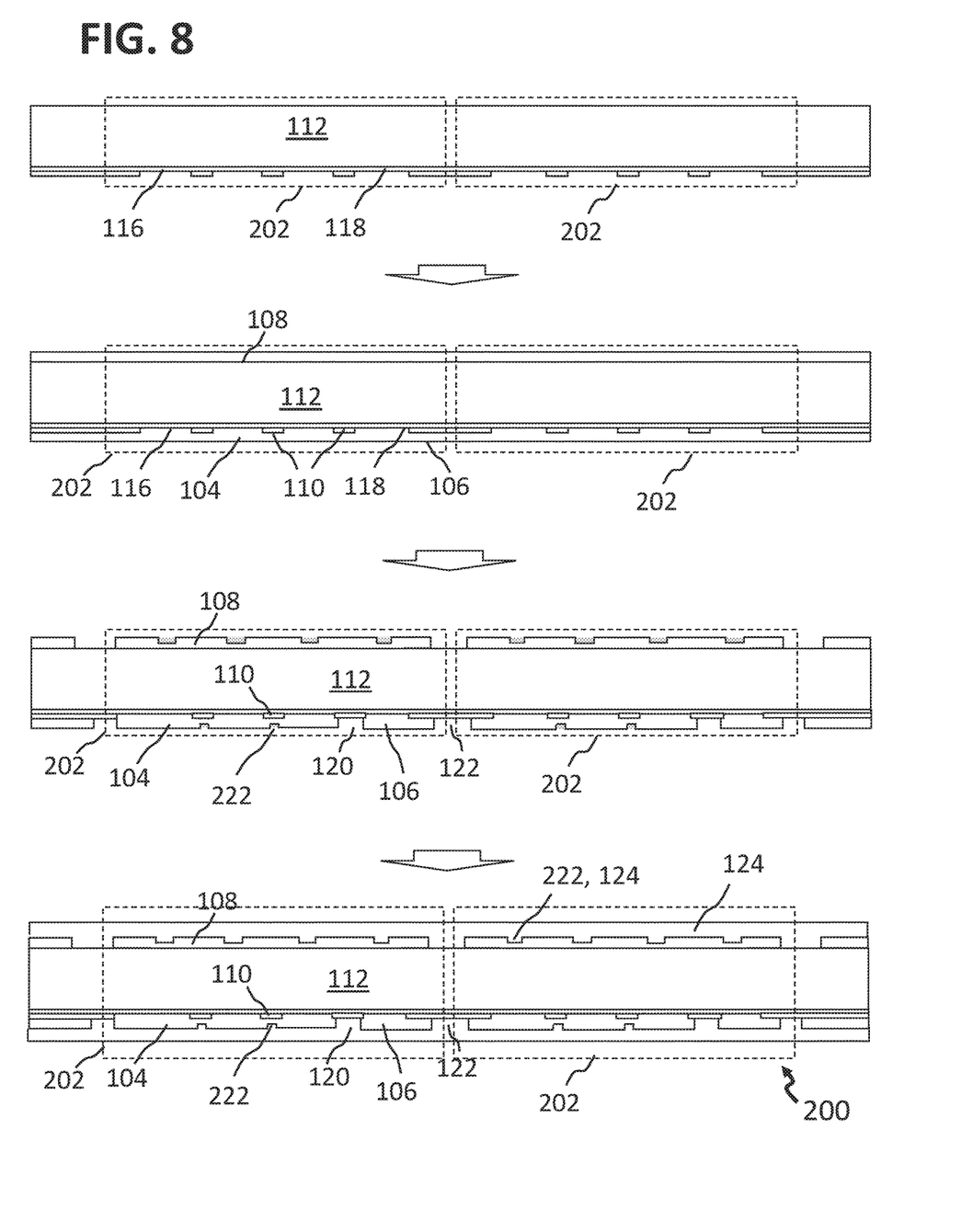
FIG. 8 illustrates, as a sequence of cross-sectional views, a process of forming a chip package in accordance with various embodiments.

Each of FIG. 3 and FIG. 4 illustrates bottom views of a chip package 102 according to a prior art and of chip packages 202 according to various embodiments, respectively. FIG. 5 illustrates a cross-sectional view of a chip package 102 according to a prior art (which is shown for, and cross-sectional views (with a zoomed in view for each) of chip packages 202 according to various embodiments. FIG. 6 illustrates cross-sectional views of chip packages 202 according to various embodiments. Each of FIG. 7 and FIG. 8 illustrates, as a sequence of cross-sectional views, a process of forming a chip package in accordance with various embodiments.

As shown in FIG. 5 (which shows at the top the chip package 102 according to a prior art for easy comparison), the chip package 202 may include a chip 112 including at least one chip pad 104, 108, and encapsulating material 124 encapsulating the chip 112. The at least one chip pad 104, 108 may for example have a first chip pad 104 on a first side of the chip 112, and a second chip pad 108 on a second side 108 of the chip. A third chip pad 106 may additionally be arranged on the first side of the chip (together with the first chip pad 104), or on the second side of the chip (together with the second chip pad 108).

The chip 112 may include or consist of an electronic circuit component, e.g. a transistor or a diode. The chip 112 may include or consists of a power component, for example a power transistor or a power diode. The chip pads 104, 106, 108 may be configured as contacts for the electronic circuit component, e.g. a control pad (e.g. gate) and two current-carrying pads (e.g., source and drain) of the transistor. The chip pad 108 may be a chip backside metallization. It may thus have a large area that may be particularly useful for a current-carrying chip pad and thus for example form the source or the drain contact of a transistor.

In various embodiments, a surface of the chip pad 104, 106, 108 may include a patterned structure including at least one predefined recess 222. FIG. 2 to FIG. 7 show various exemplary embodiments of such patterned structures including the at least one predefined recess 222. Even though particular patterns, arrangements etc. of the predefined recesses 222 may be shown in the embodiments for only one or a certain pad (e.g. only for the backside metallization, e.g. a drain, or only for a gate), it is to be understood that, in various embodiments, depending on physical limitations of the chip pad 104, 106, 108, any arrangement of the recesses 222 may be applied to any of the chip pads 104, 106, 108.

A "predefined recess" may be understood to have a shape and a location that is predefined. In various embodiments, a mask may be used for structuring the chip pad 104, 106, 108, thereby forming the at least one predefined recess 222. For example, the mask may be used for post-processing the chip pad 104, 106, 108, e.g. by wet or dry etching. The mask may for example be formed by photolithographic processes. The at least one predefined recess 222—or, more precisely, its mask counterpart, may be formed in the mask. In various embodiment, the at least one predefined recess 222 may be formed without using a mask, e.g. by laser structuring. Generally, any suitable structuring process may be used for forming the at least one predefined recess 222, preferably a structuring process that is used anyhow in a current CE manufacturing process.

The at least one predefined recess 222 may be filled with the encapsulating material 124.

Even though all the shown embodiments have more than one predefined recess 222, a single predefined recess 222 may in various embodiments be sufficient for increasing an adhesion between the chip pad 104, 106, 18 and the encapsulating material 124.

The structured surface may provide one or more anchor regions, and thereby already increase a "mechanical" adhesion between the structured surface and the encapsulating material 124, even if the at least one predefined recess 222 extends only partially through the (e.g. copper) chip pad 104, 106, 108, having the at least one predefined recess 222 formed completely in the low adhesion material. Provided that a material of the chip pad 104, 106, 108 forming side walls and a bottom of the at least one predefined recess 222 is the low adhesion material, FIG. 5 (middle) and FIG. 8 may be considered illustrative examples of such embodiments.

In various embodiments, illustrative examples of which are shown in FIG. 5 (bottom), FIG. 6 and FIG. 7, the adhesion may be further increased by forming the at least one predefined recess 222 as a through hole, i.e. deep enough to extend all the way through the chip pad 104, 106, 108. Underneath the chip pad 104, 106, 108, a material 110 may be exposed that has a higher adhesion towards the encapsulating material 124 than the material of the chip pad 104, 106, 108 (which may for example include or consist of copper or a copper alloy, e.g. AlCu, or for example Ni, NiV, Au, NiVAg, and/or NiVPd, all of which may have a low adhesion towards the encapsulating material 124). The material 110 that may be exposed at the bottom of the at least one predefined recess 222 may for example include or consist of a semiconductor material, e.g. silicon, silicon carbide or other known semiconductor materials, and/or a dielectric, material, e.g. an oxide, for example silicon dioxide ($SiO_2$), silicon nitride ($Si_3N_4$), or an organic material, e.g. polyimide (PI).

In various embodiments, the at least one chip pad 222 may include or consists of a metal layer stack with a first layer at the surface of the chip pad, the first layer including consisting of a first type of metal (for example copper or copper containing), and at least a second layer below the first layer, the second layer including or consisting of a second type of metal, for example a metal that may have a higher adhesion (than the first type of metal) towards the encapsulating material 124. The at least one predefined recess 222 may extend through the first layer, but not through the second layer. The second type of metal may for example include or consist of aluminium, nickel, and/or tungsten. Provided that a material of the chip pad 104, 106, 108 forming at least a bottom, possibly also partially the side walls, of the at least one predefined recess 222 is the second type of metal, FIG. 5 (middle) and FIG. 8 may be considered illustrative examples of such embodiments.

The at least one predefined recess may have a depth d of at least 2 µm and at most a thickness of the chip pad 104, 106, 108, e.g. a depth between about 2 µm and 8 µm, e.g. between 3 µm and 7 µm. See FIG. 5 for a respective illustration.

A thickness of the chip pad 104, 106, 108 in the recess 222 may be reduced compared with a thickness of the chip pad 104, 106, 108 outside the recess 222.

A shape of the at least one predefined recess 222 may not be limited. The shape (e.g., a shape of a circumference of the recess 222 within a plane of the chip pad 104, 106, 108) may for example be elliptical, e.g. round (as for example shown in FIG. 2, third embodiment), polygonal, e.g. rectangular (as for example shown in FIG. 2, second embodiment, FIG. 3, first, second, and fourth embodiment, and FIG. 4, first and fourth embodiment), e.g. square (as for example shown in FIG. 2, first embodiment FIG. 3, third embodiment, and FIG. 4, second embodiment), or essentially any shape.

A width w of the at least one recess 222 (see FIG. 5 for a respective illustration) may be in a range from about 10 µm to about 100 µm, e.g. from about 20 µm to about 80 µm, e.g, from about 30 µm to about 60 µm. The maximum size and the number of the recesses 222 may be limited by a design (e.g. shape) of the chip pads 104, 106, 108, and by a number of microvias (e.g. µ vias) that may need to be formed in the chip package 202 and that may be physically and electrically connected to the chip pad 104, 106, 108.

The at least one predefined recess 222 may include a plurality of predefined recesses 222. See FIG. 2 to FIG. 8 for respective illustrations. The plurality of predefined recesses 222 may for example form an array of predefined recesses 222, for example a matrix arrangement of recesses 222, as in the second, third, and fourth exemplary embodiment of FIG. 3 and in the first and second exemplary embodiment of FIG. 4, or a grid of recesses 222 with the recesses 222 forming lines of the grid, as in the first embodiment of FIG. 3 and in the third embodiment of FIG. 4. In various embodiments, the arrangement of the plurality of predefined recesses 222 may be irregular, for example as shown in the embodiments of FIG. 2.

In various embodiments, the array of predefined recesses 222 may span the whole surface of the chip pad 104, 106, 108. In other words, for a grid of lines forming the recesses 222, the lines may extend to edges of the chip pad 104, 106, 108, as for example shown in FIG. 3, first embodiment, and FIG. 4, third embodiment. For an array pattern of individual recesses 222, the recesses 222 may be arranged on the surface of the chip pad 104, 106, 108 in such a way that, for each of the recesses 222 nearest the edges of the chip pad 104, 106, 108, a neighboring array arranged according to the array pattern would land outside the surface of the chip pad 104, 106, 108. Exemplary embodiments are shown in FIG. 3, second, third, and fourth embodiment, and in FIG. 4, first and second embodiment.

In various embodiments, the array of predefined recesses 222 may extend over only a portion of the surface of the chip pad 104, 106, 108. In other words, regarding the array pattern, at least for one of the recesses 222, a neighboring recess 222 could in principle be arranged according to the array pattern, but no recess 222 is arranged at the position, or regarding the grid, the grid lines may not extend all the way to the edges of the chip pad 104, 106, 108.

In various embodiments, as for example shown in FIG. 2, second embodiment, and FIG. 3, second and fourth embodiment, the at least one predefined recess 222 may include at least one groove, for example a plurality of grooves. In various embodiments, the at least one groove of the plurality of grooves may have its long axis along a first direction, and at least one further groove of the plurality of grooves may have its long axis along a second direction different from the first direction. This is shown in FIG. 2, second embodiment, for the chip pads 104, 108, and in FIG. 3, third embodiment. All of the grooves may in various embodiments be parallel, as for example shown in FIG. 2, second embodiment, for the chip pads 106, in FIG. 3, second embodiment, and in FIG. 4, first embodiment. The grid lines of FIG. 3, first embodiment, and of FIG. 4, third embodiment, may be considered intersecting grooves.

A distance S (see FIG. 3) between adjacent recesses 222 may in various embodiments be in a range from about 100 µm to about 150 µm. As a consequence, a density of the plurality of predefined recesses 222 on the surface of the chip pad 104, 106, 108 may be smaller or larger. This is visualized in FIG. 3, with the distance S between adjacent recesses decreasing from the left column to the right column, and correspondingly the density of recesses 222 increasing from left to right.

In various embodiments, the surface of the chip pad 104, 106, 108 (without taking into account the at least one recess 222) may have a surface roughness $R_z$ of at most 3 µm, for example between about 0.5 µm and 2 µm.

In various embodiments, as for example shown in FIG. 6, the chip package 202 may include at least one via 224 (e.g. µ via) in contact with a predefined area on the pad 104, 106, 108. A location of the at least one predefined recess 222 may have no overlap with the predefined area of the at least one via 224. This is shown in the top views of the embodiments of FIG. 2, right column, and FIG. 4, right column.

As illustrated in FIG. 7 in the sequence of cross-sectional views, the process of forming a chip package in accordance with various embodiments may include panel plating with subsequent structuring of the plated metal layers, the chip pads 104, 106, 108.

As shown in FIG. 7, on a semiconductor chip 112, a chip pad 104, 106, 108 may be arranged (second panel). The chip pad 104 may be the source pad of a transistor, the chip pad 106 may be the gate pad, and the chip pad 108 may be the drain pad. The chip pads 104, 106, 108 may for example be formed by sputtering and subsequent copper plat g.

As shown in the first panel of FIG. 7, the source pad 104 and the gate pad 106 may be formed on a first metal layer 118 that may be formed by a metal with a relatively low adhesion towards an encapsulating material 124, e.g. AlCu. In various embodiments, the first metal layer 118 may be provided on both sides of the chip 112, or on none. At least at certain predefined positions, a material 110 may be arranged as a passivation layer between the first metal layer 118 and the chip pad 104, 106, 108. The material 110 may protect the first metal layer 118 from the etch chemistry used for forming the recess 222. It may be a dielectric material. Between the source pad 104 and the gate pad 106, the material 110 may be arranged in the layer of material 110 for separating the source pad 104 from the gate pad 106. In a case of a metal material 110 as the passivation layer, a dielectric material may be used for separating the source pad 104 from the gate pad 106. In various embodiments, a barrier layer may be provided as (e.g. part of) the first metal layer 118 or in addition to the first metal layer 118.

Examples of a stack formed by the chip pad 104, 106, 108 and optionally the first metal layer, the material 110 and the barrier layer, may include AlCu and/or Cu in combination with a passivation layer and/or a barrier layer, or none of passivation layer and barrier layer.

As shown in the third panel, subsequently, the front- and the back side may be structured, for example using lithography and etching. On the front side, the source pad 104 and the gate pad 106 may be separated from each other by forming a pad separation 120, and on the backside, the copper may be removed from dicing streets 122.

In various embodiments, the at least one predefined recess 222 may be formed at the same time as the dicing streets 122 or as the pad separation 120. For example, the predefined recesses 222 on the back side may be formed at the same time as the dicing streets 122, and/or the predefined recesses 222 on the front side may be formed at the same time as the pad separation 120 and the dicing streets 122 on the front side. In various embodiments, only a mask used for the etching process may be configured differently than in a standard process.

As shown in the fourth panel, an encapsulating material 124 may be arranged over both sides of the chip 112, for example by molding or laminating. The encapsulating material 124 may be arranged as a layer and may intrude into the predefined recesses 222, where it may solidify. The solid encapsulating material 124 may be "locked" to the chip pads 104, 106, 108 in the predefined recesses 222, for example as described above.

FIG. 8 illustrates, as a sequence of cross-sectional views, a process of forming a chip package in accordance with various embodiments.

The process illustrated in FIG. 8 may differ from process shown in FIG. 7 in that the structuring of the frontside metallization 104, 106 and of the backside metallization 108 may at least partially be performed by structured deposition, e.g. plating using a mask.

In various embodiments, at least some of the structuring, e.g. the forming the pad separation 122 and the dicing streets 120. This process may allow to form recesses 222 that do not extend all the way through the chip pads 104, 106, 108.

This means that in case the recesses 222 are only formed partially through the metallization 104, 106, 108 (e.g. copper), an additional etching process may be required. A number and a shape of the recesses 222 may not be limited.

In FIG. 7 and FIG. 8, for an easy identification of the recesses 222 and distinction from the pad separation 120 and the dicing streets 122, the recesses 222 are shown with a gray shading in the third panel.

Figure 9:
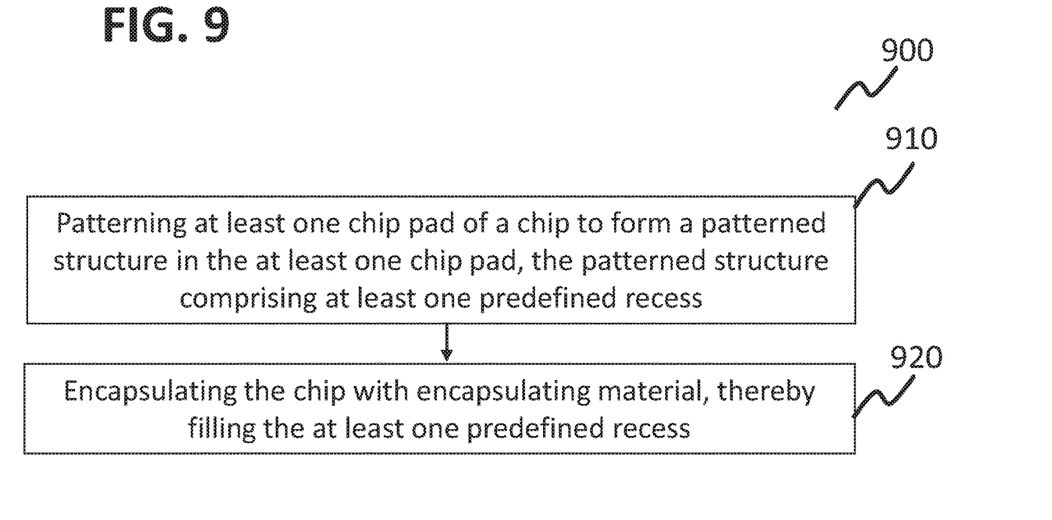
FIG. 9 shows a process flow of a method of manufacturing a chip package in accordance with various embodiments.

FIG. 9 shows a process flow 900 of a method of manufacturing a chip package in accordance with various embodiments.

The method may include patterning at least one chip pad of a chip to form a patterned structure in the at least one chip pad, the patterned structure including at least one predefined recess (in 910), and encapsulating the chip with encapsulating material, thereby filling the at least one predefined recess (in 920).

Various examples will be illustrated in the following:

Example 1 is a method of manufacturing a chip package. The method may include patterning at least one chip pad of a chip to form a patterned structure in the at least one chip pad, the patterned structure including at least one predefined recess, and encapsulating the chip with encapsulating material, thereby filling the at least one predefined recess.

In Example 2, the subject-matter of Example 1 may optionally include that the at least one chip pad is patterned using a mask.

In Example 3, the subject-matter of Example 1 may optionally include that the at least one predefined recess is formed by processing the chip pad using a mask.

In Example 4, the subject-matter of any of Examples 1 to 3 may optionally include that the forming the at least one predefined recess includes or consists of etching.

In Example 5, the subject-matter of Example 1 may optionally include that the forming the at least one predefined recess includes or consists of laser processing.

In Example 6, the subject-matter of Example 1 may optionally include that the forming the at least one predefined recess includes forming the at least one predefined recess during a pattern plating process.

In Example 7, the subject-matter of any of Examples 1 to 6 may optionally include that the forming the at least one predefined recess includes reducing a thickness of the chip pad in at least one predefined area of the chip pad.

In Example 8, the subject-matter of any of Examples 1 to 7 may optionally include that the patterning the at least one chip pad is performed at a wafer level.

In Example 9, the subject-matter of Example 8 may optionally include that the encapsulating is performed at the wafer level.

In Example 10, the subject-matter of any of Examples 1 to 9 may optionally include that the encapsulating includes laminating the chip with a laminate.

In Example 11, the subject-matter of any of Examples 1 to 9 may optionally include that the encapsulating includes molding.

In Example 12, the subject-matter of any of Examples 1 to 11 may optionally include that the patterning the at least one chip pad includes forming a plurality of the predefined recesses.

In Example 13, the subject-matter of any of Examples 1 to 12 may optionally include that the forming the plurality of predefined recesses includes forming the plurality of predefined recesses as an array of recesses.

Example 14 is a chip package. The chip package may include a chip including at least one chip pad, encapsulating material encapsulating the chip, wherein a surface of the chip pad includes a patterned structure including at least one predefined recess, wherein the at least one predefined recess is filled with the encapsulating material.

In Example 15, the subject-matter of Example 14 may optionally include that the at least one predefined recess has a depth of at least 2 µm.

In Example 16, the subject-matter of Example 14 or 15 may optionally include that the patterned structure includes a mask-patterned structure.

In Example 17, the subject-matter of any of Examples 14 to 16 may optionally include that the at least one predefined recess includes at least one through hole extending through the entire thickness of the at least one chip pad.

In Example 18, the subject-matter of any of Examples 14 to 17 may optionally include that, at a bottom of the at least one predefined recess, a semiconductor material and/or a dielectric material is exposed.

In Example 19, the subject-matter of any of Examples 14 to 18 may optionally include that a material at the surface of the chip pad includes or consists of copper.

In Example 20, the subject-matter of any of Examples 14 to 19 may optionally include that the at least one chip pad includes or consists of a metal layer stack with a first layer at the surface of the chip pad, the first layer including or consisting of a first type of metal, and at least a second layer below the first layer, the second layer including or consisting of a second type of metal.

In Example 21, the subject-matter of Example 20 may optionally include that the at least one predefined recess extends through the first layer, but not through the second layer.

In Example 22, the subject-matter of Example 20 or 21 may optionally include that the first type of metal is copper.

In Example 23, the subject-matter of any of Examples 20 to 22 may optionally include that the second type of metal is from a group of metals, the group including aluminium, nickel, and tungsten.

In Example 24, the subject-matter of any of Examples 14 to 23 may optionally include that a thickness of the chip pad in the recess is reduced compared with a thickness of the chip pad outside the recess.

In Example 25, the subject-matter of any of Examples 14 to 24 may optionally include that the at least one predefined recess includes a plurality of predefined recesses.

In Example 26, the subject-matter of Example 25 may optionally include that the plurality of predefined recesses forms an array of predefined recesses.

In Example 27, the subject-matter of Example 26 may optionally include that the array of predefined recesses spans the whole surface of the chip pad.

In Example 28, the subject-matter of any of Examples 14 to 27 may optionally include that the at least one predefined recess includes at least one groove.

In Example 29, the subject-matter of Example 28 may optionally include that the at least one groove includes a plurality of grooves.

In Example 30, the subject-matter of Example 29 may optionally include that at least one groove of the plurality of grooves has its long axis along a first direction, and at least one further groove of the plurality of grooves has its long axis along a second direction different from the first direction.

In Example 31, the subject-matter of Example 29 or 30 may optionally include that the plurality of grooves are intersecting.

In Example 32, the subject-matter of Example 31 may optionally include that the plurality of intersecting grooves includes or consists of a grid of grooves.

In Example 33, the subject-matter of any of Examples 14 to 32 may optionally include that a width of the at least one recess is in a range from about 10 μm to about 100 μm.

In Example 34, the subject-matter of any of Examples 14 to 33 may optionally include that a distance between adjacent recesses is in a range from about 100 μm to about 150 μm.

In Example 35, the subject-matter of any of Examples 14 to 34 may optionally include that the chip includes or consists of a power component.

In Example 36, the subject-matter of Example 35 may optionally include that the power component includes or consists of a power transistor.

In Example 37, the subject-matter of any of Examples 14 to 36 may optionally include that the chip includes or consists of a transistor.

In Example 37, the subject-matter of any of Examples 14 to 18 may optionally include that the at least one chip pad includes a chip backside metallization.

In Example 39, the subject-matter of any of Examples 14 to 38 may optionally include that the at least one chip pad includes a current-carrying pad.

In Example 40, the subject-matter of any of Examples 14 to 39 may optionally include that the at least one chip pad includes a source or a drain pad.

In Example 41, the subject-matter of any of Examples 14 to 40 may optionally include that the at least one chip pad includes a control pad.

In Example 42, the subject-matter of any of Examples 14 to 41 may optionally include that the at least one chip pad includes a gate pad.

In Example 43, the subject-matter of any of Examples 14 to 42 may optionally further include at least one via in contact with a predefined area on the pad, wherein a location of the at least one predefined recess has no overlap with the predefined area of the at least one via.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of manufacturing a chip package, the method comprising:
    patterning at least one chip pad of a chip to form a patterned structure in the at least one chip pad, the patterned structure comprising at least one predefined recess; and
    encapsulating the chip with encapsulating material, thereby filling the at least one predefined recess,
    wherein the at least one predefined recess is formed by processing the at least one chip pad using a mask.

2. The method of claim 1, further comprising:
    forming the at least one predefined recess by etching.

3. The method of claim 1, further comprising:
    forming another predefined recess by laser processing.

4. The method of claim 1, further comprising:
    forming the at least one predefined recess by reducing a thickness of the at least one chip pad in at least one predefined area of the at least one chip pad.

5. The method of claim 1, wherein encapsulating the chip with encapsulating material comprises laminating the chip with a laminate.

6. The method of claim 1, wherein patterning the at least one chip pad comprises forming a plurality of the predefined recesses.

7. The method of claim 6, wherein forming the plurality of predefined recesses comprises forming the plurality of predefined recesses as an array of recesses.

8. The method of claim 1, wherein the at least one chip pad is a chip backside metallization.

9. A method of manufacturing a chip package, the method comprising:
    patterning at least one chip pad of a chip to form a patterned structure in the at least one chip pad, the patterned structure comprising at least one predefined recess; and
    encapsulating the chip with encapsulating material, thereby filling the at least one predefined recess, wherein the at least one predefined recess is formed by laser processing.

* * * * *